(12) United States Patent
Chung

(10) Patent No.: US 7,541,271 B2
(45) Date of Patent: Jun. 2, 2009

(54) MOS TRANSISTORS HAVING LOW-RESISTANCE SALICIDE GATES AND A SELF-ALIGNED CONTACT BETWEEN THEM AND METHOD OF MANUFACTURE

(75) Inventor: Henry Wei-Ming Chung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/799,815

(22) Filed: May 2, 2007

(65) Prior Publication Data

US 2007/0207602 A1    Sep. 6, 2007

Related U.S. Application Data

(62) Division of application No. 11/042,276, filed on Jan. 24, 2005.

(51) Int. Cl.
*H01L 21/822* (2006.01)
(52) U.S. Cl. .................................... 438/597
(58) Field of Classification Search .......... 438/197, 438/199, 622, 638, 597
See application file for complete search history.

(56) References Cited

U.S. PATENT DOCUMENTS

| | | | |
|---|---|---|---|
| 6,271,083 B1 * | 8/2001 | Lou | 438/253 |
| 6,312,985 B1 * | 11/2001 | Wu et al. | 438/253 |
| 6,803,318 B1 | 10/2004 | Qiao et al. | |
| 6,856,019 B2 * | 2/2005 | Tamaru et al. | 257/758 |
| 6,991,978 B2 * | 1/2006 | Kuan et al. | 438/211 |
| 2004/0018679 A1 * | 1/2004 | Yu et al. | 438/253 |
| 2004/0115874 A1 * | 6/2004 | Amon et al. | 438/200 |

FOREIGN PATENT DOCUMENTS

CN    1440070 A    9/2003

* cited by examiner

*Primary Examiner*—David S Blum
(74) *Attorney, Agent, or Firm*—Stout, Uxa, Buyan & Mullins, LLP

(57) ABSTRACT

A method for forming a self-aligned contact between two MOS transistors is described. The method supports the use of low-resistivity silicides for the formation of contacts in nanometer applications that employ polycide techniques. Silicon nitride and photoresist material act as dual masks in the formation of the self-aligned contact.

21 Claims, 7 Drawing Sheets

MOS TRANSISTORS HAVING LOW-RESISTANCE SALICIDE GATES AND A SELF-ALIGNED CONTACT BETWEEN THEM AND METHOD OF MANUFACTURE

This application is a divisional of U.S. application Ser. No. 11/042,276, filed Jan. 24, 2005.

BACKGROUND OF THE INVENTION

1. Field of the Invention

The present invention relates generally to semiconductor fabrication methods and, more particularly, to providing a self-aligned contact between two MOS transistors.

2. Description of Related Art

Fabrication of memory arrays conventionally employs the use of self-aligned contacts when high density is desired. One type of self-aligned contact takes the form of a salicide layer formed on a polysilicon gate of a MOS transistor. Another type of self-aligned contact takes the form of conducting material that connects a substrate to a metal layer disposed above a MOS transistor in an integrated circuit. A polycide has been used to form a self-aligned contact in these situations.

One commonly used polycide is tungsten silicide. Tungsten silicide may perform adequately in applications with larger geometries. However, as the density of memory arrays increases, the relatively high resistivity of tungsten silicide may preclude its use in nanometer process technologies.

Silicides with lower resistivity such as titanium silicide, cobalt silicide, and nickel silicide are available. These lower resistivity silicides could be candidates for replacing tungsten silicide in nanometer applications. Unfortunately, however, these lower resistivity silicides may not be suitable for use in many prior art applications, such as polycide techniques, because of their lack of high temperature stability.

A need thus exists in the prior art for an improved method of forming a self-aligned contact in high-density memory arrays. A further need exists for forming a self-aligned contact from materials lacking in high temperature stability.

SUMMARY OF THE INVENTION

The present invention addresses these needs by providing a method for forming a self-aligned contact between first and second structures formed on a substrate. An implementation of the method of the invention herein disclosed may comprise forming the first and second structures with a space between them on a surface of a semiconductor substrate. Caps of first material may be formed over upper surfaces of the structures such that the caps are separated. The caps may extend over the space between the structures more near the upper surfaces than near the substrate. According to an aspect of this implementation of the method, layers of second material are formed above the caps. The layers extend over a portion of the caps such that a space between the layers is greater than the space between the caps. The layers are formed such that a portion of each of the caps beneath the space between the layers is not overlain by the layers of second material. According to another aspect of this implementation of the method, the caps comprise hard masks and the layers of second material comprise a second insulator layer. By forming photoresist patterns on the layers of second material, a contact hole can be formed that uses the caps and the photoresist patterns as masks. The contact hole can extend down to the substrate.

An exemplary embodiment of the present invention may comprise a semiconductor element produced by the above method.

According to another implementation of the method of the present invention, first and second structures separated by a region may be formed over a semiconductor substrate. First and second masks may be formed at respective first and second levels above the structures. The first masks may be separated by a lateral distance smaller than a lateral dimension of the region with the first masks extending over the region more near upper surfaces of the structures than near the substrate. The second masks may be separated by a distance not less than the lateral distance.

Another exemplary embodiment of the present invention may comprise a pair of metal oxide semiconductor field effect transistors having a contact hole between them. The transistors may include a substrate comprised of semiconductor material capable of forming a field effect channel. The transistors further may comprise a dielectric layer that overlies at least part of the substrate with the contact hole extending through the dielectric layer and reaching the substrate. The transistors still further may comprise first and second polysilicon gates disposed over the dielectric layer and further may comprise oxide material disposed between the polysilicon gates. The contact hole may extend through the oxide material between the polysilicon gates. The transistors even still further may comprise salicide contacts formed on the polysilicon gates and separated by the oxide material. The contact hole may extend both through the oxide material and between the salicide contacts.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
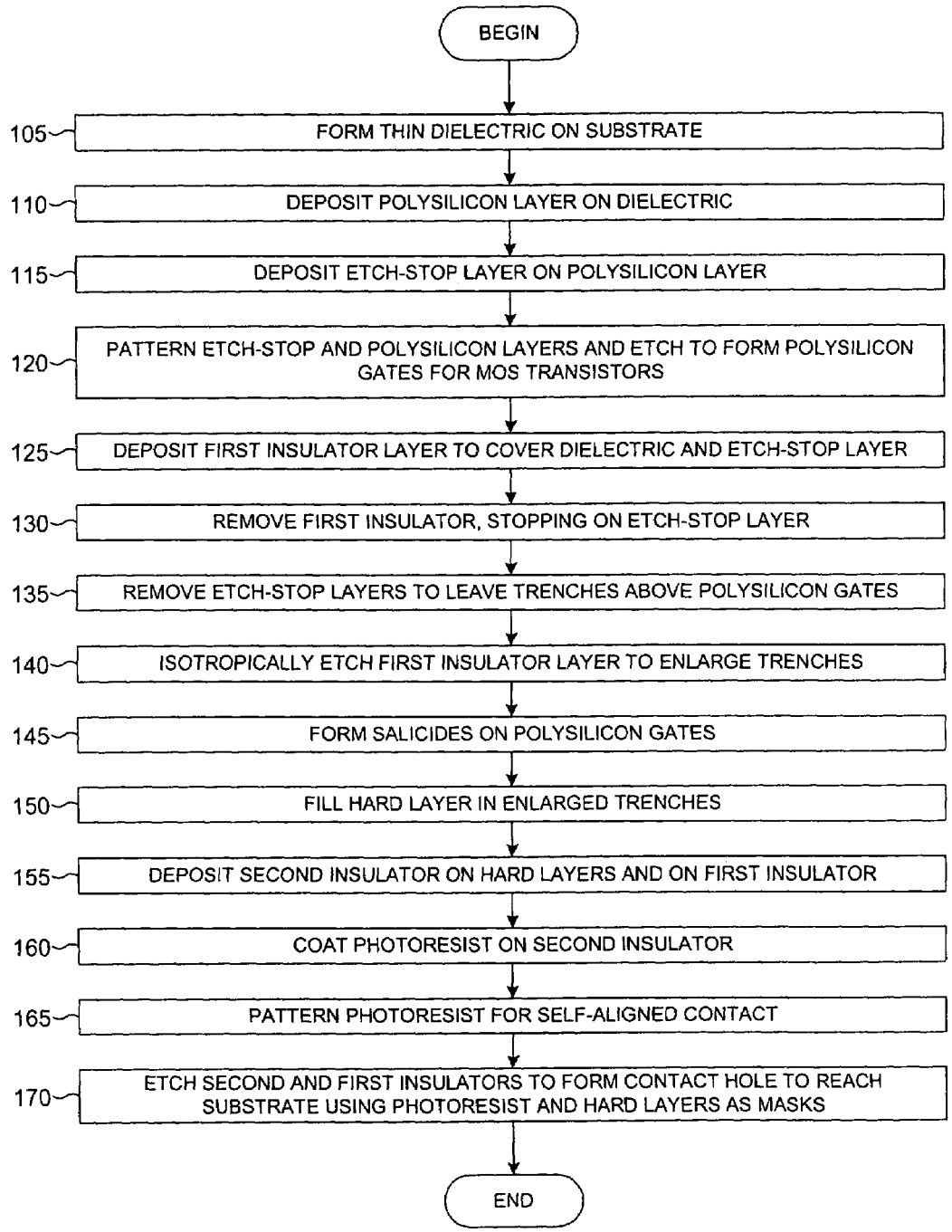
FIG. 1 is a flow diagram that illustrates an implementation of a method for forming a self-aligned contact between first and second MOS transistors.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of MOS transistors or of self-aligned contacts. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to fabrication of a self-aligned contact between two MOS transistors.

Referring more particularly to the drawings, FIG. 1 is a flow diagram that describes an implementation of a method for forming a self-aligned contact (SAC). This implementation may apply to formation of a SAC between first and second adjacent metal oxide semiconductor (MOS) transistors. The description of this implementation of the method refers to FIGS. 3-7, FIG. 8A, and FIGS. 9-13.

Figure 3:
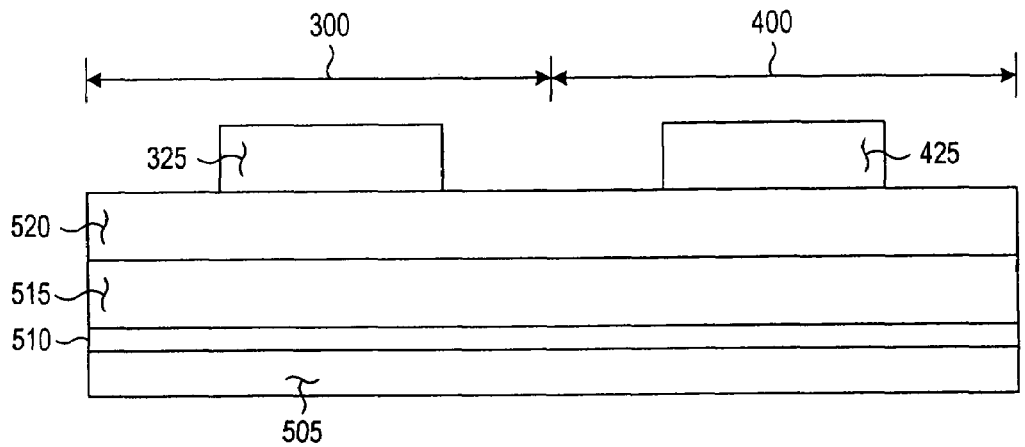
FIGS. 3-7 are cross-sectional views of successive early stages in an implementation of a method according to the present invention.

With reference to FIG. 3, a thin dielectric layer 510 can be formed on the upper surface of a substrate 505 at step 105. The substrate 505 may be, for example, a semiconductor wafer (e.g., a silicon wafer). The thin dielectric layer 510 typically is formed substantially of silicon dioxide on the substrate 505. A layer 515 composed substantially of polysilicon can be disposed on the dielectric layer at step 110 using, for example, a chemical vapor deposition (CVD) process. Preferably, the polysilicon material is doped to enhance the conductivity of the gate formed therefrom. An etch-stop layer 520 can be formed on the polysilicon layer 515 at step 115. The etch-stop layer 520 typically is composed substantially of silicon nitride. According to one implementation of the present method, the etch-stop layer 520 can be coated with a photoresist material, and the photoresist material can be patterned using a photolithographic process. The photolithographic process may leave two photoresist features 325 and 425 on the upper surface of the etch-stop layer 520. The photoresist features 325 and 425 can be used as etching masks to pattern the underlying etch-stop layer 520 and polysilicon layer 515 to define a gate region for the first MOS transistor 300 and for the second MOS transistor 400.

Figure 4:
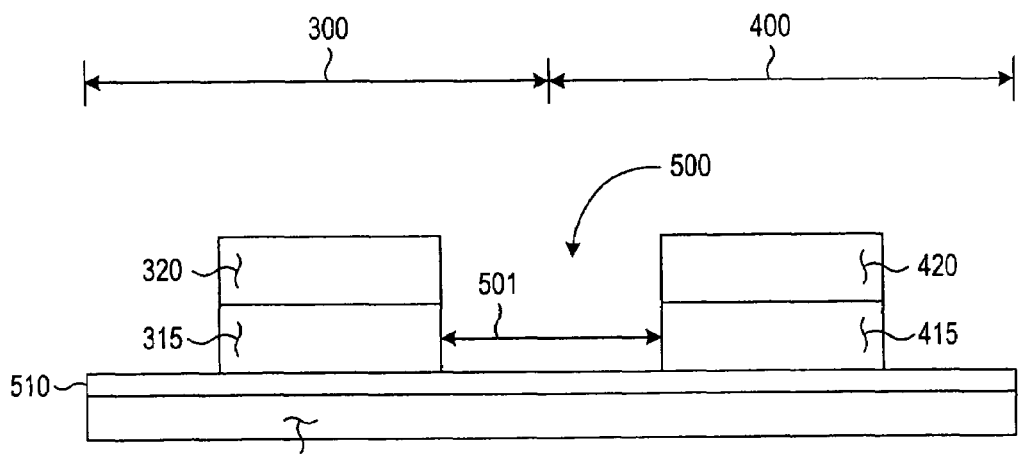

Referring to FIGS. 3 and 4, an etch operation can remove the exposed portions of the etch-stop layer 520 and the polysilicon layer 515, stopping at the thin dielectric layer 510 at step 120. The etch operation may include, for example, multiple etching processes performed in sequence. For example, an etch process may be a selective etch process (e.g., a dry plasma etch process) in which the etchant has a higher selectivity for nitride than for polysilicon. A second etch process may be a selective etch process (e.g., a dry plasma etch process) in which the etchant has a higher selectivity for polysilicon than for oxide so that the etch operation stops substantially at the upper surface of the dielectric layer 510. The etch operation at step 120 can create a gate 315 for the first MOS transistor 300 formed from the polysilicon layer 515. The etch operation at step 120 likewise can leave in place an etch-stop layer 320 that overlies the gate 315. By the same process, the etch operation at step 120 can create a gate 415 for the second MOS transistor 400 formed from the polysilicon layer 515. The gate 515 is overlain by an etch-stop layer 420.

Figure 5:
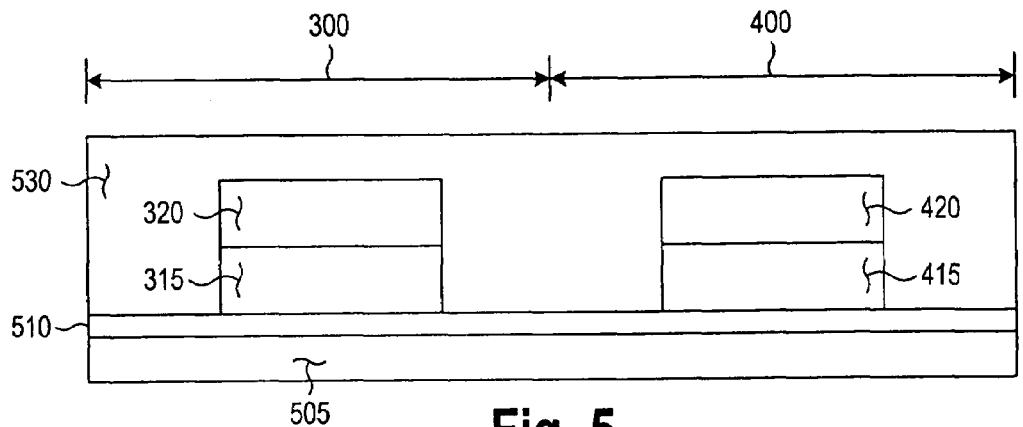
Figure 6:
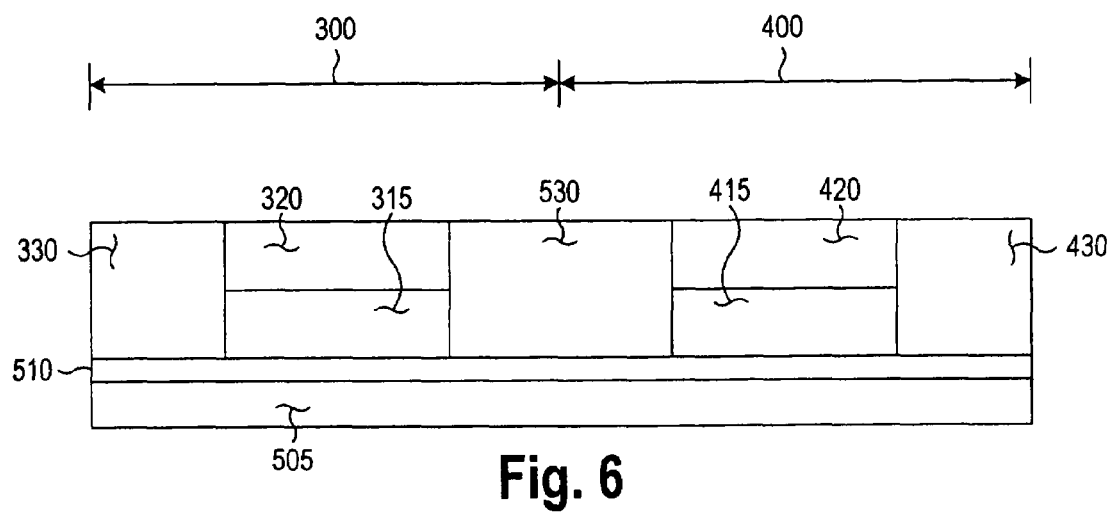

Referring to FIG. 5, a first insulator layer 530 can be deposited at step 125 to cover the dielectric layer 510 and the etch-stop layers 320 and 420. The first insulator layer 530 may be formed substantially of silicon dioxide. The first insulator layer 530 may be partially removed by chemical mechanical polishing (CMP) at step 130 using the etch-stop layers 320 and 420 to halt the CMP process. With reference to FIGS. 5 and 6, performing CMP at step 130 can create three separate regions in the first insulator layer 530. These regions comprise a region 330 lying to the left of the gate 315 of the first MOS transistor 300, a region 430 lying to the right of the gate 415 of the second MOS transistor 400, and a region 530 lying between the gates 315 and 415 of the first and second MOS transistors 300 and 400.

Figure 7:
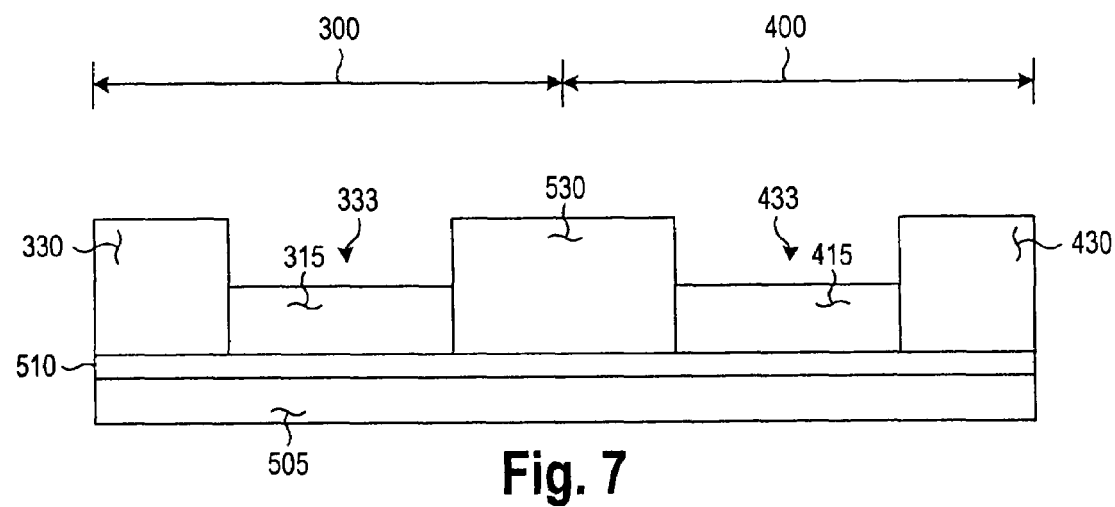

Referring to FIG. 7, the etch-stop layers 320 and 420 can be removed at step 135, leaving first and second trenches 333 and 433 above the respective first and second polysilicon gates 315 and 415. For example, where the etch-stop layers 320 and 420 are composed of silicon nitride, a selective etch in which the etchant has a higher selectivity for nitride than for polysilicon and has a higher selectivity for nitride than for oxide may be employed to remove the silicon nitride, thereby exposing the polysilicon gates 315 and 415.

Figure 8A:
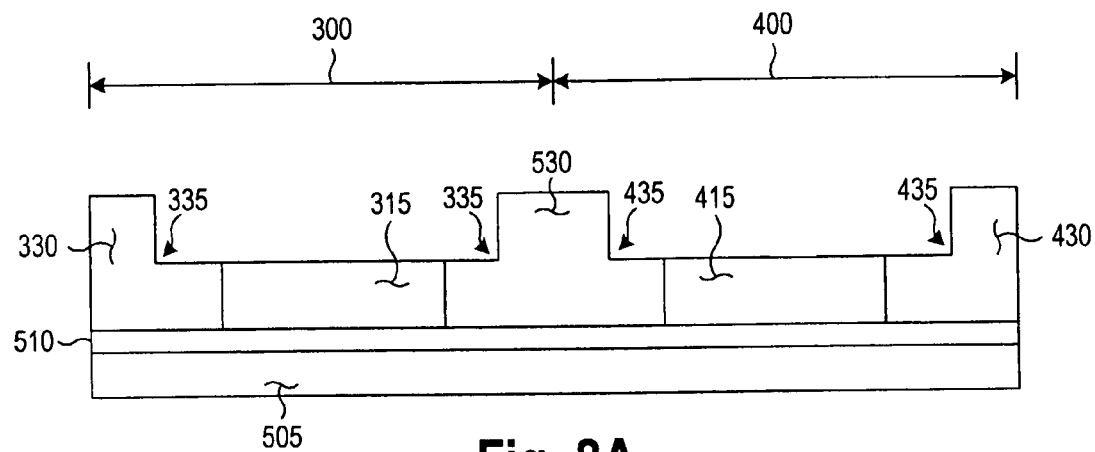
FIG. 8A is a cross-sectional view of one stage of the aforementioned implementation of a method according to the present invention.

With reference to FIG. 8A, an isotropic etch can be performed on the first insulator layer regions 330, 530, and 430 at step 140 to enlarge the first and second trenches 333 and 433 thus forming enlarged first and second trenches 335 and 435. The enlarged first and second trenches 335 and 435 may extend partially into the first insulator layer regions 330, 530, and 430. The etch process employed at step 140, according to the embodiment illustrated in FIG. 8A, may be a selective etch process (e.g., a dry plasma etch process) in which the etchant has a higher selectivity for oxide than for polysilicon.

Figure 9:
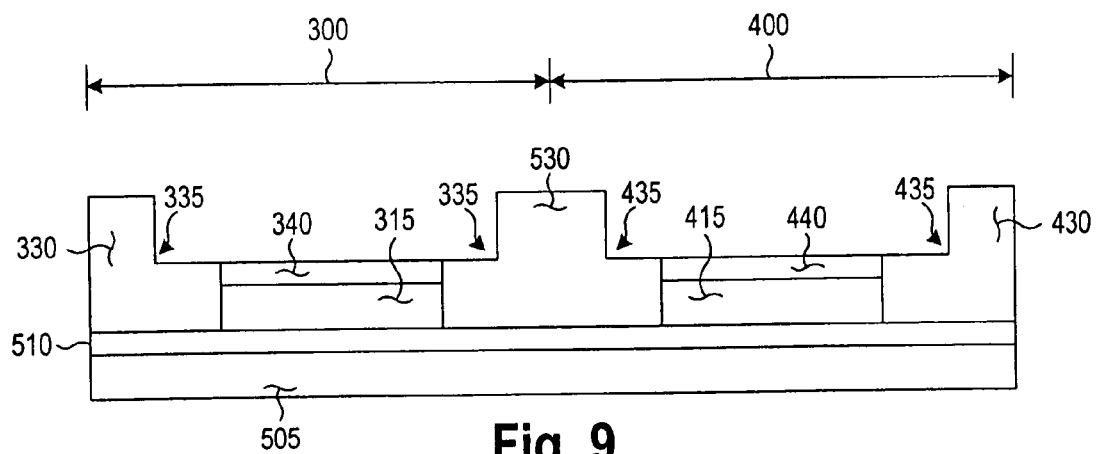
FIGS. 9-13 are cross-sectional views of later successive stages in an implementation of a method according to the present invention.

Turning to FIG. 9, a first salicide 340 can be formed on the first polysilicon gate 315, and a second salicide 440 can be formed on the second polysilicon gate 415 at step 145. First and second salicides 340 and 440 may be formed of titanium silicide, cobalt silicide, nickel silicide or tungsten silicide. Titanium silicide, cobalt silicide, and nickel silicide may be preferred over tungsten silicide because of their lower resistivities when compared to the resistivity of tungsten silicide. First and second silicides 340 and 440 may form electrically conductive contacts on the polysilicon gates 315 and 415. According to an illustrative embodiment, silicides 340 and 440 are deposited via CVD.

Figure 10:
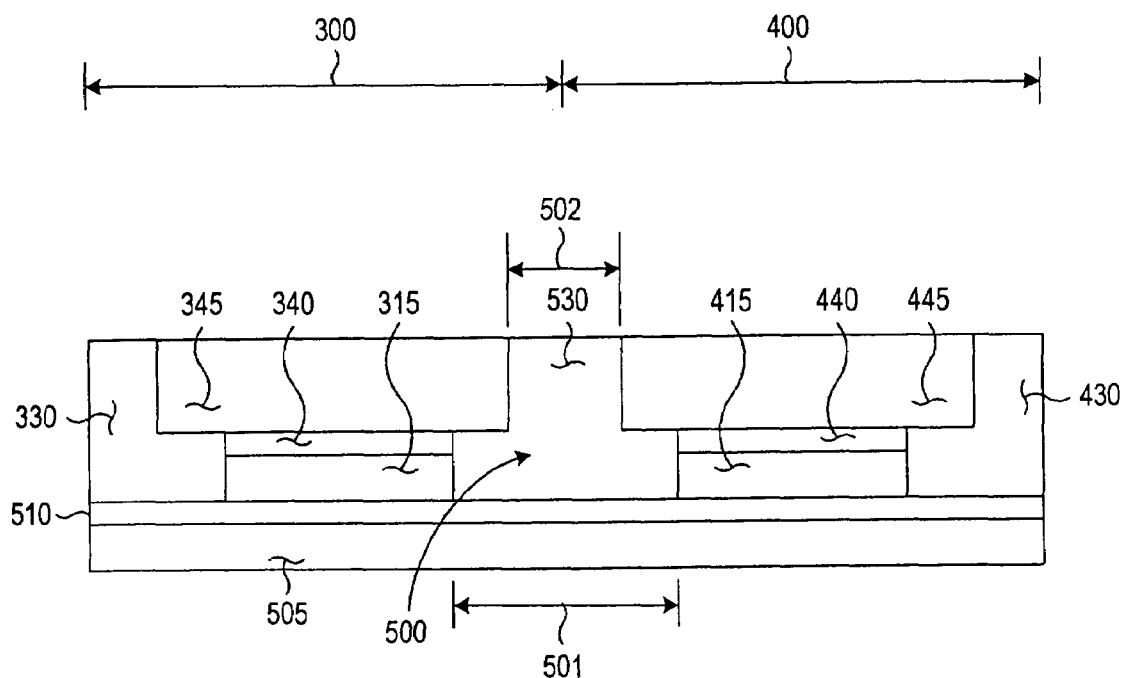

In FIG. 10 a first material can be filled into the first trench 335 overlying the salicide 340 and the second trench 435 overlying the salicide 440 at step 150. According to an exemplary embodiment, the first material may comprise silicon nitride that forms respective hard layers 345 and 445. The hard layers 345 and 445 may form caps that lie over upper surfaces of polysilicon gates 315 and 415.

Figure 11:
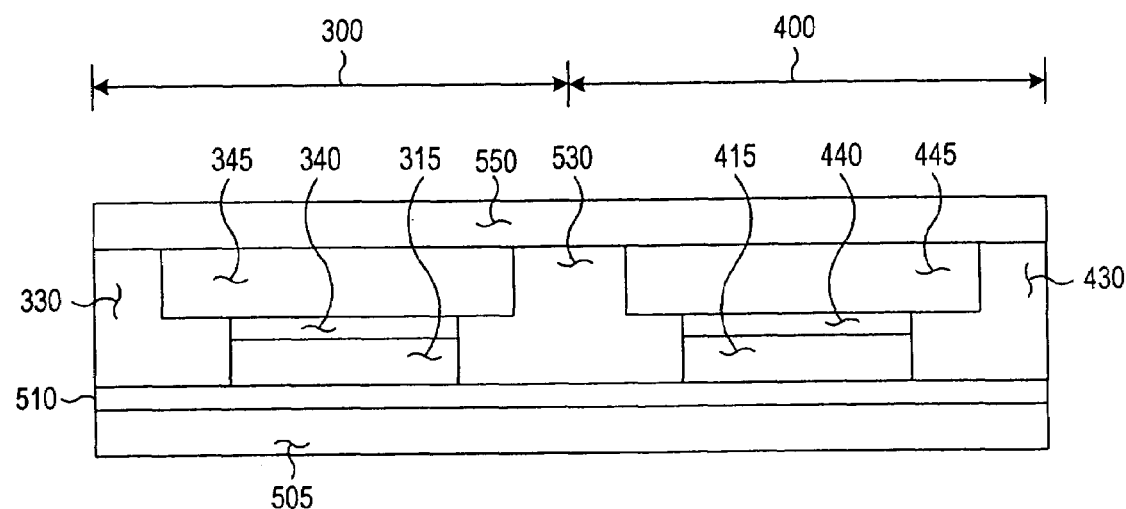

Referring to FIG. 11, a layer of second material can be grown or deposited on the caps (i.e. hard layers 345 and 445) and on the first insulator layer regions 330, 530, and 430 at step 155. The layer of second material may comprise a second insulator layer 550, which may be composed substantially of silicon dioxide, and which may be used as an interlayer dielectric. The second insulator layer 550 is then coated with a photoresist material at step 160.

Figure 13:
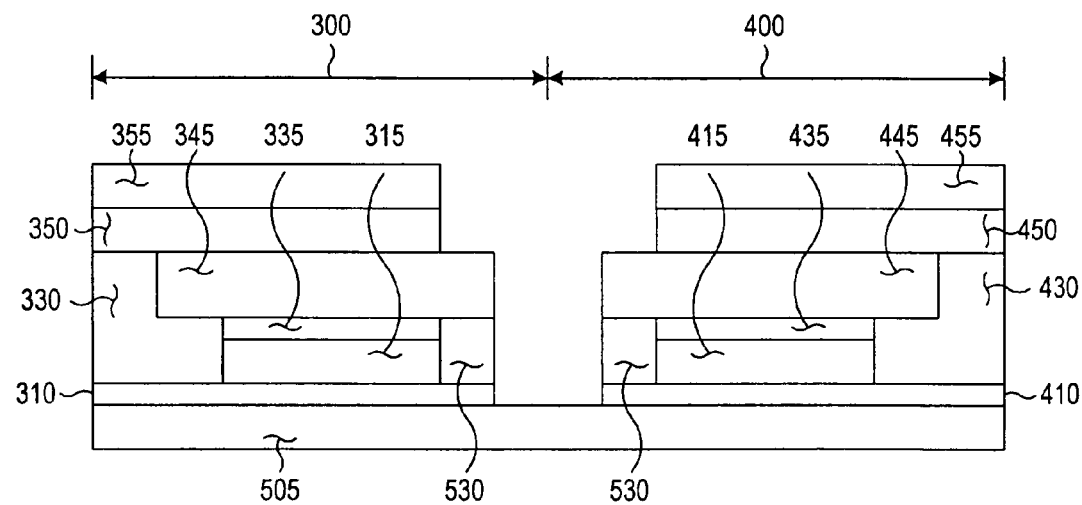

With reference to FIG. 13, the photoresist material can be formed into photoresist patterns 355 and 455 at step 165 to define a self-aligned contact. An etch can then be performed at step 170 to remove a portion of the second insulator layer 550, the first insulator layer 530, and the dielectric layer 510 according to the photoresist patterns 355 and 455 and according to the hard layers 345 and 445. Removing the portion of the second insulator layer 550 forms interdielectric layers 350 and 450. According to an illustrative implementation of the method, the etch process uses the photoresist patterns 355 and 455, and the caps (i.e. hard layers 345 and 445) as masks. The etch can form a contact hole by removing material not protected by the masks in order to expose the substrate 505 in a region between the first MOS transistor 300 and the second MOS transistor 400. Removing the portion of the thin dielectric layer 510 between the first MOS transistor 300 and the second MOS transistor 400 creates two separate dielectric layers 310 and 410. The first separate dielectric layer 310 can insulate the gate 315 of the first MOS transistor 300 from the substrate. Likewise, the second separate dielectric layer 410 can insulate the gate 415 of the second MOS transistor 400 from the substrate. Conductive material may be deposited into the hole to form a self-aligned contact with the substrate between the two MOS transistors 300 and 400. This conductive material may comprise a polycide.

Figure 2:
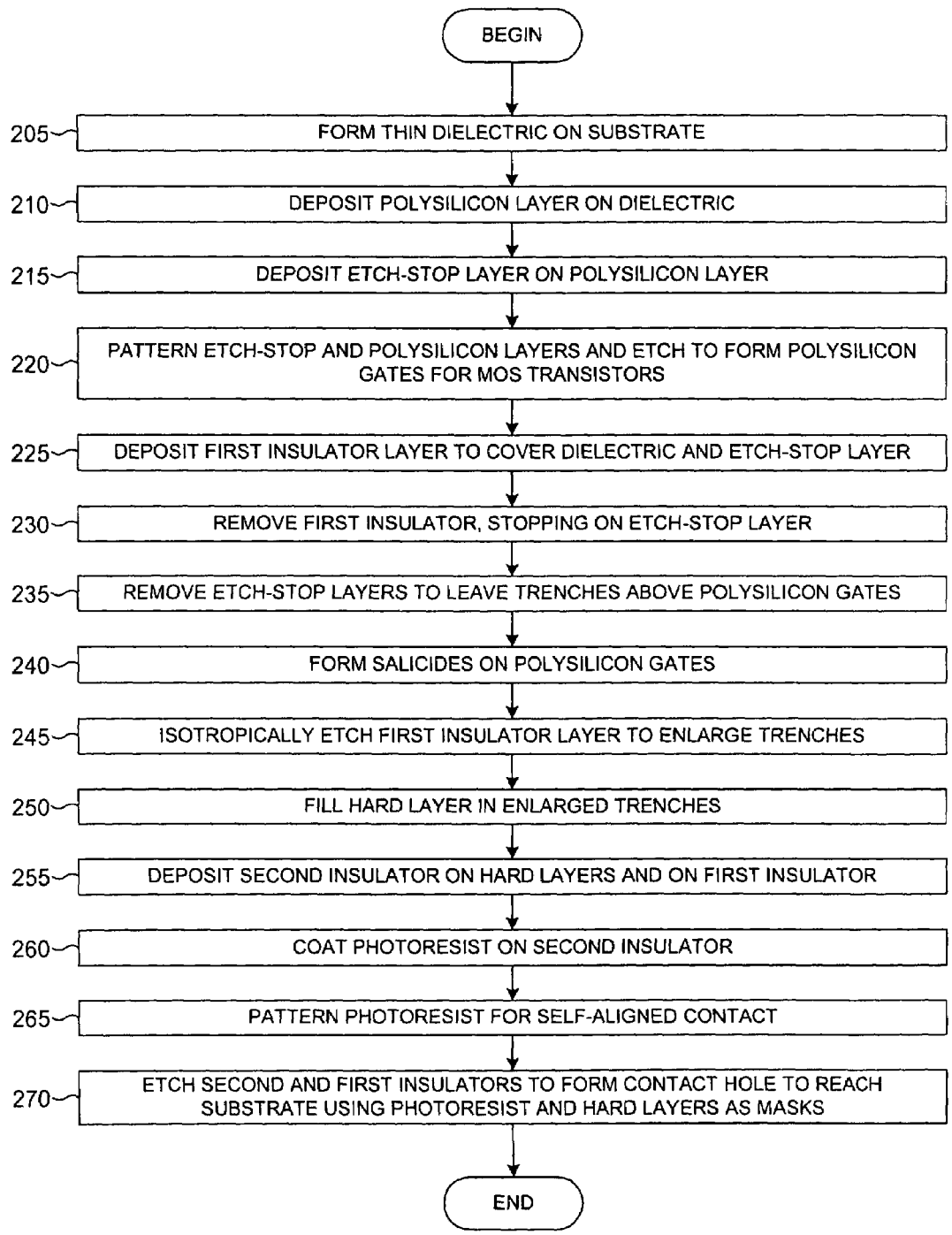
FIG. 2 is a flow diagram that illustrates an alternative implementation of a method for forming a self-aligned contact between first and second MOS transistors.

FIG. 2 is a flow diagram that describes one alternative implementation of a method for forming a self-aligned contact (SAC). This alternative implementation may comprise steps that are identical to the steps that described the method in the discussion of FIG. 1 except for two steps that are interchanged. Accordingly, the alternative implementation of the present method forms a thin dielectric layer 510 on a substrate 505 at step 205 (Cf. FIG. 3), deposits a polysilicon layer 515 on the dielectric layer 510 at step 210, deposits an etch-stop layer 520 on the polysilicon layer 515 at step 215, and patterns the etch-stop layer 520 and polysilicon layer 515 to form first and second polysilicon gates 315 and 415 for respective first and second MOS transistors 300 and 400 at step 220 (Cf. FIG. 4). The polysilicon gates 315 and 415, which are overlain by etch-stop layers 320 and 420, are separated by a region 500 having a lateral dimension 501. The first and second polysilicon gates 315 and 415 are then overlain by respective first and second etch-stop layers 320 and 420. A first insulator layer 530 is then deposited at step 225 to cover the dielectric layer 510 and the etch-stop layers 320 and 420 (Cf. FIG. 5). A top portion of the first insulator layer 530 may be removed by chemical mechanical polishing (CMP) at step 230 to expose the etch-stop layers 320 and 420 (Cf. FIG. 6). The etch-stop layers 320 and 420 are then removed at step 235, leaving first and second trenches 333 and 433 above the respective first and second polysilicon gates 315 and 415 (Cf. FIG. 7).

Figure 8B:
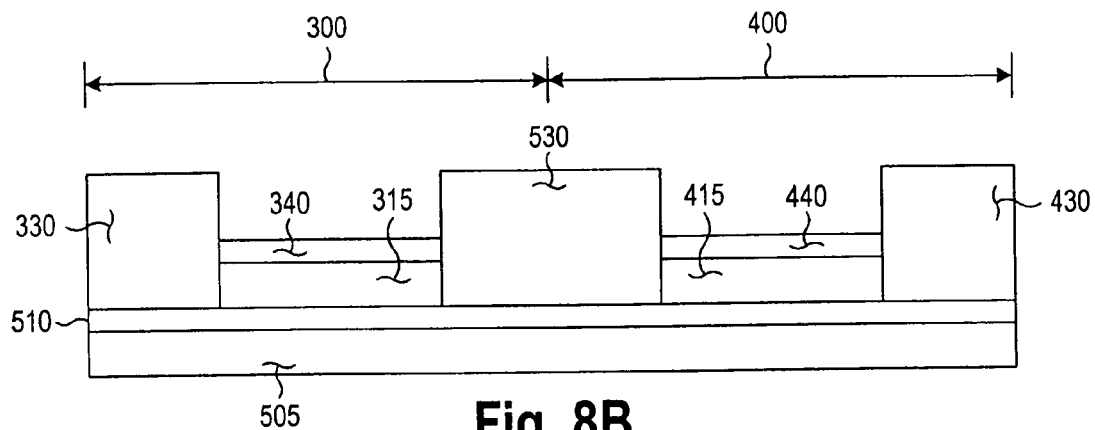
FIG. 8B is a cross-sectional view of one stage of the aforementioned alternative implementation of a method according to the present invention.

In contrast with the previous implementation, the alternative implementation of the present method forms first and second salicides 340 and 440 on respective first and second polysilicon gates 315 and 415 at step 240 before enlarging first and second trenches 333 and 433. The result of step 240 is illustrated in FIG. 8B. The present alternative implementation of the method can continue by performing an isotropic etch on the first insulator layer at step 245 to enlarge the first and second trenches 333 and 433. As with the previous implementation, the resulting enlarged first and second trenches 335 and 435 may extend partially into the first insulator layer regions 330, 530, and 430 (Cf. FIG. 9).

Figure 12:
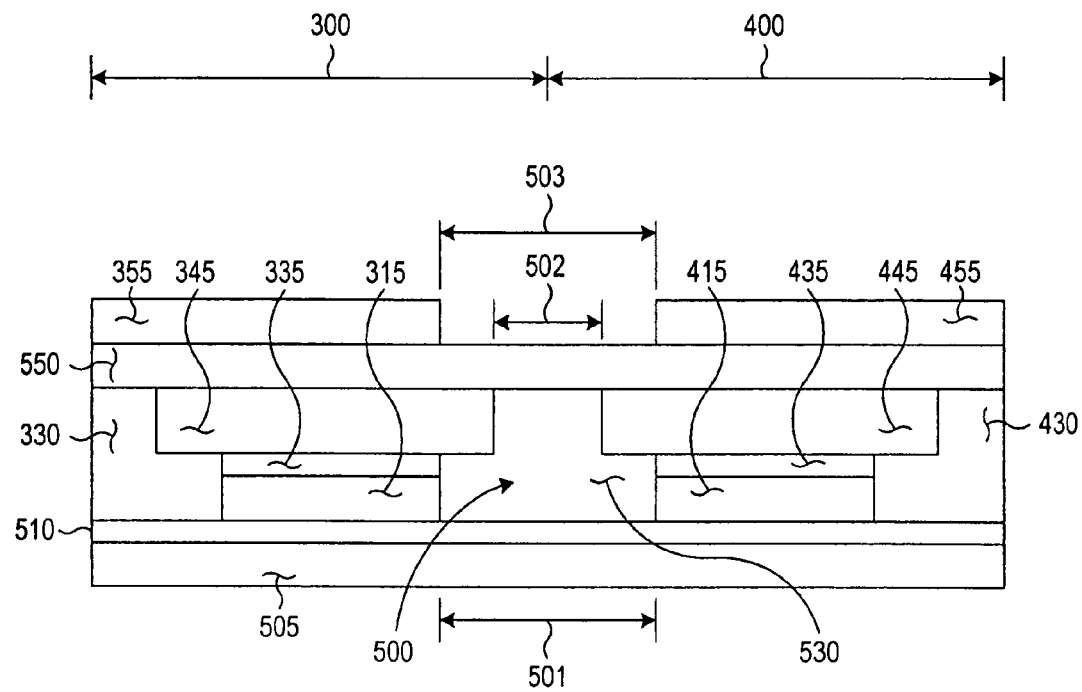

The alternative implementation can continue, following the previous method, at step 250 by filling the first trench 335 with hard layer 345 and filling the second trench 435 with hard layer 445 (Cf. FIG. 10). Hard layers 345 and 445 thus are formed at a first level above the polysilicon gates 315 and 415 and may function as first masks at a later step of the method. It should be noted that the hard layers 345 and 445 may be separated by a lateral distance 502 smaller than the lateral dimension 501 of the region 500. A second insulator layer 550 can be deposited on both the hard layers 345 and 445 and the first insulator layer regions 330, 530, and 430 (FIG. 11) at step 255. The second insulator layer 550 can be coated with a photoresist material at step 260, and the photoresist material can be formed into photoresist patterns 355 and 455 at step 265 to define a self-aligned contact (FIG. 12). The photoresist patterns 355 and 455 thus are formed at a second level above the polysilicon gates 315 and 415 and may function as second masks at a later step of the method. In the illustrated embodiment the photoresist patterns 355 and 455 are separated by a lateral distance 503 that is the same as the lateral dimension 501 of the region 500. According to an alternative embodiment, the lateral distance 503 may be, for example, smaller than the lateral dimension 501. Using the second masks (i.e. photoresist patterns 335 and 455) and the first masks (i.e. hard layers 345 and 445), an etch can be performed at step 270 that removes portions of the second insulator layer 550, the first insulator layer region 530, and the dielectric layer 510 according to the photoresist patterns 335, 455 and the hard layers 345, 445 (Cf. FIG. 13). The resulting structure is a contact hole that reaches the substrate in the region 500 between the first MOS transistor 300 and the second MOS transistor 400.

In view of the foregoing, it will be understood by those skilled in the art that the methods of the present invention can facilitate formation of MOS transistor devices, and in particular pairs of adjacent MOS transistors having a contact hole between them, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method, comprising:

forming first and second structures with a space between them over a surface of a substrate, wherein the forming of first and second structures comprises forming first and second gate elements on a dielectric layer formed on the surface of the substrate, the respective first and second gate elements are part of respective first and second metal-oxide-semiconductor (MOS) transistors, and the forming of first and second gate elements comprises:
   forming a dielectric layer on the substrate;
   forming a polysilicon layer on the dielectric layer;
   forming an etch-stop layer on the polysilicon layer;
   patterning the etch-stop layer and polysilicon layer and etching to form a first polysilicon gate element for the first MOS transistor and a second polysilicon gate element for the second MOS transistor;
   forming a first insulator layer to cover the dielectric and the etch-stop layer;
   etching back the first insulator layer to stop on the etch-stop layer; and
   removing the etch-stop layer to leave a first trench above the first polysilicon gate element and a second trench above the second polysilicon gate element;
forming a first cap of first material over an upper surface of the first structure;
forming a second cap of first material over an upper surface of the second structure, the caps being separated from each other and extending over the space more near the upper surfaces than near the substrate;
forming a layer of second material above the first cap of first material;
forming a layer of second material above the second cap of first material, the layers extending over a portion of the first and second caps such that a space between the layers is greater than the space between the first and second caps and such that a portion of each of the first and second caps beneath the space between the layers is not overlain by the layers of second material, the first material and the second material being different materials; and
forming a contact hole reaching the substrate.

2. The method as set forth in claim 1, wherein the forming of an etch-stop layer comprises forming a layer of silicon nitride.

3. The method as set forth in claim 1, wherein the forming of a first insulator layer comprises forming a layer of silicon dioxide.

4. The method as set forth in claim 1, wherein the etching back of the first insulator layer comprises chemical-mechanical polishing.

5. The method as set forth in claim 1, further comprising:
   isotropically etching the first insulator layer to enlarge the first trench and the second trench;
   forming a first salicide on the first polysilicon gate element; and
   forming a second salicide on the second polysilicon gate element.

6. The method as set forth in claim 5, wherein: the forming of a first salicide comprises forming a salicide selected from the group consisting of titanium salicide, cobalt salicide, and nickel salicide; and the forming of a second salicide comprises forming a salicide selected from the group consisting of titanium salicide, cobalt salicide, and nickel salicide.

7. The method as set forth in claim 5, further comprising:
   forming the first cap in the first enlarged trench;
   forming the second cap in the second enlarged trench;
   forming the layers of second material on the first and second caps and on the first insulator layer; and
   coating a photoresist material on the layers of second material; forming photoresist patterns for a self-aligned contact;
   wherein the contact hole is formed by etching the layers of second material and the first insulator layer to form the contact hole extending through the second material and first insulator layer using the photoresist patterns and caps as masks.

8. The method as set forth in claim 7, wherein the forming of the caps in the first and second enlarged trenches is preceded by forming the salicide layers in the enlarged trenches.

9. The method as set forth in claim 7, wherein: the first and second caps comprise first and second hard layers; the layers of second material comprise a second insulator layer; and the etching comprises etching the second and first insulator layers and the dielectric layer to form the contact hole extending through the second and first insulator layers and the dielectric layer to reach the substrate using the photoresist patterns and first and second caps as masks.

10. The method as set forth in claim 7, wherein the forming of the caps in the first and second enlarged trenches comprises filling the trenches with silicon nitride and the forming of a second insulator layer comprises forming a layer of silicon dioxide.

11. The method as set forth in claim 1, wherein the contact hole is disposed between the first cap and the second cap.

12. A method, comprising:
   forming over a substrate first and second structures separated by a region;
   disposing a first insulating layer adjacent to the first and second structures;
   disposing an etch-stop layer on the first and second structures;
   etching the etch-stop layer to form first and second trenches above the structures;
   forming first masks at a first level above the first and second structures, the first masks being separated by a lateral distance smaller than a lateral dimension of the region, the first masks further extending over the region more near the upper surfaces than near the substrate;
   forming second masks at a second level above the first and second structures, the second masks being separated by a distance not less than the lateral distance;
   forming a second insulating layer between the first masks and the second masks, the second insulating layer extending over the first masks and over the first insulating layers; and
   forming a contact hole reaching the substrate.

13. The method as set forth in claim 12, wherein the forming of first masks comprises forming first masks that are separated by a lateral distance smaller than a smallest lateral dimension of the region.

14. The method as set forth in claim 12, wherein: the second masks are formed on the second insulating layer; and the contact hole is formed by etching the second and first insulator layers to form the contact hole extending through the second and first insulator layers.

15. The method as set forth in claim 14, wherein: the second masks comprise a photoresist material; the forming of the second masks comprises forming patterns in the photoresist material for a self-aligned contact; and the etching of the second and first insulator layers comprises etching according to the first and second masks.

16. The method as set forth in claim 15, wherein: a dielectric layer is disposed over the substrate; and the etching according to the first and second masks further comprises etching the second and first insulator layers and the dielectric layer to reach the substrate.

17. The method as set forth in claim 12, wherein the contact hole is disposed between the first masks.

18. A method, comprising:
   forming over a substrate first and second structures separated by a region, wherein the forming of the first and second structures comprises forming first and second polysilicon gates on a dielectric layer on the substrate, the polysilicon gates being part of respective first and second metal-oxide-semiconductor (MOS) transistors;
   disposing a first insulating layer adjacent to the first and second structures;
   disposing an etch-stop layer on the first and second structures;
   etching the etch-stop layer to form first and second trenches above the structures;
   forming a salicide layer on the polysilicon gates;
   isotropically etching the first insulator layer to enlarge the first and second trenches;
   forming first masks at a first level above the first and second structures, the first masks being separated by a lateral distance smaller than a lateral dimension of the region, the first masks further extending over the region more near the upper surfaces than near the substrate;
   forming second masks at a second level above the first and second structures, the second masks being separated by a distance not less than the lateral distance; and
   forming a contact hole reaching the substrate.

19. The method as set forth in claim 18, wherein the contact hole is disposed between the first masks.

20. A method, comprising:
   forming over a substrate first and second structures separated by a region;
   disposing a first insulating layer adjacent to the first and second Structures;
   disposing an etch-stop layer on the first and second structures;
   etching the etch-stop layer to form first and second trenches above the structures;
   isotropically etching the first insulator layer to enlarge the first and second trenches;
   forming a salicide layer on the polysilicon gates;
   forming first masks in the enlarged trenches at a first level above the first and second structures, the first masks being separated by a lateral distance smaller than a lateral dimension of the region, the first masks further extending over the region more near the upper surfaces than near the substrate;
   forming second masks at a second level above the first and second structures, the second masks being separated by a distance not less than the lateral distance; and
   forming a contact hole reaching the substrate.

21. The method as set forth in claim 20, wherein the contact hole is disposed between the first masks.

\* \* \* \* \*